United States Patent
Lenz et al.

(10) Patent No.: US 10,379,182 B2
(45) Date of Patent: Aug. 13, 2019

(54) CIRCUIT ARRANGEMENT FOR AN MRT SYSTEM, MRT SYSTEM AND METHOD FOR OPERATING AN MRT SYSTEM

(71) Applicant: Siemens Healthcare GmbH, Erlangen (DE)

(72) Inventors: Helmut Lenz, Oberasbach (DE); Matthias Gebhardt, Erlangen (DE); Dirk Schneiderbanger, Langensendelbach (DE); Roland Werner, Langensendelbach (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 16/181,504

(22) Filed: Nov. 6, 2018

(65) Prior Publication Data
US 2019/0137580 A1 May 9, 2019

(30) Foreign Application Priority Data
Nov. 9, 2017 (DE) .................... 10 2017 219 907 A

(51) Int. Cl.
*G01V 3/00* (2006.01)
*G01R 33/385* (2006.01)
(Continued)

(52) U.S. Cl.
CPC ....... *G01R 33/3852* (2013.01); *G01R 33/288* (2013.01); *G01R 33/543* (2013.01);
(Continued)

(58) Field of Classification Search
CPC .................................................. G01R 33/3852
(Continued)

(56) References Cited

U.S. PATENT DOCUMENTS 6,671,329 B1 12/2003 Lenz
6,671,330 B1 12/2003 Lenz
(Continued)

FOREIGN PATENT DOCUMENTS

DE 19857524 A1 6/2000
DE 19857525 A1 6/2000
(Continued)

OTHER PUBLICATIONS

German Office Action for German Application No. 102017219907.5 dated May 17, 2018. (With English Translation).
(Continued)

*Primary Examiner* — Louis M Arana
(74) *Attorney, Agent, or Firm* — Harness, Dickey & Pierce, P.L.C.

(57) ABSTRACT

A circuit arrangement for an MRT system and a method for operating an MRT system are disclosed. The circuit arrangement includes a gradient amplifier having a switch-mode output stage, a regulator device, and a modulator connected therebetween in the circuit. To ensure patient safety, a control path is integrated into a drive path of the circuit arrangement or the MRT system provided for driving a gradient coil, the gradient coil being connected to an output of the switch-mode output stage. The control path includes a limiter stage connected downstream of the regulator device, the modulator, the switch-mode output stage and its supply voltage. The limiter stage is connected in the circuit between the regulator device and an input of the modulator, to limit a control signal output by the regulator device and limit the voltage for the gradient coil provided by the switch-mode output stage at its output.

24 Claims, 5 Drawing Sheets

(51) Int. Cl.
*H03F 3/217* (2006.01)
*G01R 33/54* (2006.01)
*G01R 33/28* (2006.01)

(52) U.S. Cl.
CPC ....... *H03F 3/217* (2013.01); *H03F 2200/129* (2013.01); *H03F 2200/301* (2013.01); *H03F 2200/312* (2013.01); *H03F 2200/351* (2013.01); *H03F 2200/462* (2013.01)

(58) Field of Classification Search
USPC .................................................. 324/318, 322
See application file for complete search history.

(56) References Cited

U.S. PATENT DOCUMENTS

| 8,860,523 | B2* | 10/2014 | Odagiri | H03F 3/217 327/134 |
| 9,874,617 | B2* | 1/2018 | Ham | G01R 33/3852 |
| 10,024,935 | B2* | 7/2018 | Ham | G01R 33/3852 |
| 2007/0075773 | A1 | 4/2007 | Lenz | |
| 2007/0262892 | A1 | 11/2007 | Lenz | |
| 2013/0257533 | A1* | 10/2013 | Krabbenborg | G05F 5/00 330/251 |
| 2017/0234950 | A1* | 8/2017 | Lenz | G01R 33/3852 324/322 |
| 2018/0074138 | A1 | 3/2018 | Bielmeier | |

FOREIGN PATENT DOCUMENTS

| DE | 10353965 | A1 | 6/2005 |
| DE | 102006017520 | A1 | 10/2007 |
| DE | 102016202443 | B3 | 5/2017 |
| DE | 102016217223 | A1 | 3/2018 |

OTHER PUBLICATIONS

German Decision to Grant for German Application No. 102017219907.5 dated Jun. 18, 2018. (With English Translation).

* cited by examiner

CIRCUIT ARRANGEMENT FOR AN MRT SYSTEM, MRT SYSTEM AND METHOD FOR OPERATING AN MRT SYSTEM

PRIORITY STATEMENT

The present application hereby claims priority under 35 U.S.C. § 119 to German patent application number DE 102017219907.5 filed Nov. 9, 2017, the entire contents of which are hereby incorporated herein by reference.

FIELD

Embodiments of the invention generally relate to a circuit arrangement for an MRT system, to an MRT system having a circuit arrangement of an embodiment, and to a method for operating an MRT system of an embodiment.

BACKGROUND

In present-day magnetic resonance tomography (MRT), or nuclear spin tomography as it is also known, high voltages, field strengths and gradients, i.e. spatial changes, in particular in the magnetic flux density B, and rapid changes with respect to time, i.e. rates of change, come into play. At the same time, implants, in particular of types comprising metallic components, are in increasingly widespread use. In order to examine patients fitted with an implant, in particular with an active implant, such as, for example, a cardiac pacemaker, a defibrillator or a neurostimulator, in a nuclear spin tomography machine, i.e. in an MRT system, the implants must on the one hand be suitable for an examination of the type, i.e. for use in an MRT system, and on the other hand the MRT system must not lead to the patient, the implant or a function of the implant being put at risk or provoke correspondingly hazardous conditions. Potential risks or unwanted effects are just as likely to reside in a defect, a failure or a malfunction of the implant, for example due to induced voltages, electrical or magnetic fields, as in a causing of burns to the patient due to the heating-up of the implant during the examination. Depending on the type of implant, it is also possible in certain circumstances for cardiac arrhythmias to occur as a result of a nerve stimulation, since the implant can constitute an antenna for electrical and magnetic fields.

Although modern-day MRT systems are generally very reliable and safe in operation, they are at the same time characterized by an enormous complexity. Furthermore, users themselves can set parameters of the MRT system that are used in a measurement sequence and/or can even program measurement sequences. Comprehensive additional protective measures are therefore necessary in order to satisfy current requirements relating to patient safety. This can lead for example to certain functionalities being configured with full redundancy, involving huge overheads in terms of components, manufacturing processes and costs. For example, two actual values of a coil current could be determined and provided independently of one another, and provision could be made for two independent monitoring circuits, for example DSP (Digital Signal Processing) modules, in a system controller and for two separate independent shutdown routes or shutdown paths.

DE 198 57 525 A1 discloses a power amplifier, in particular a gradient amplifier of a nuclear spin tomography apparatus, comprising a switched output stage and a pulse width modulator. In order to avoid short-circuit driving actions in the output stage, a clock generator and a plurality of safety time circuits may be provided in the power amplifier. Thus, if a soft-stop signal is transmitted in order to initiate a shutdown, the corresponding safety times are observed, i.e. the shutdown is performed in a correspondingly clocked manner. In response to the soft-stop signal, the switched output stage forms a bypass to a gradient coil, for which purpose, in a corresponding H-bridge, two switches of the switched output stage are turned on or closed and two other switches of the switched output stage are turned off or opened.

DE 10 2016 202 443 B3 describes a circuit arrangement, a gradient amplifier for magnetic resonance imaging, and a method for compensating for nonlinearities.

SUMMARY

At least one embodiment of the present invention enables safe operation in the interests of patient safety, in particular a safe shutdown, of an MRT system, with particularly low overheads in terms of components and costs.

Advantageous embodiments and developments of the invention are disclosed in the claims as well as in the description and in the drawings.

At least one embodiment of the invention is directed to a circuit arrangement comprising a gradient amplifier and may be provided, i.e. embodied or configured, in particular for use or deployment in an MRT system, in particular in an MRT system according to at least one embodiment of the invention. The gradient amplifier comprises a switch-mode output stage, a regulator device and a modulator. The switch-mode output stage is configured to provide a voltage for a gradient coil of the MRT system at an output of the switch-mode output stage. The voltage is therefore provided at the output, while the gradient coil can be electrically connected directly or indirectly, i.e. without or with intermediary elements, to the output. In this configuration, multiple, in particular three, gradient coils can be connected accordingly, i.e. supplied with the or a respective voltage. Depending on requirements or on the embodiment of the MRT system, the gradient amplifier can therefore provide one or more voltages at one or more outputs of the switch-mode output stage. A plurality of gradient amplifiers may also be employed in the MRT system.

At least one embodiment of the inventive MRT system comprises at least one embodiment of an inventive circuit arrangement, a control device connected to the circuit arrangement in order to specify the limit setting for the limiter stage and the current measuring unit arranged on the output side of the switch-mode output stage for the purpose of measuring the current actual value, the current measuring unit being electrically connected to the regulator device in order to transmit the current actual value to the regulator device. The control device may be in particular the control device already cited elsewhere. In addition, the MRT system may equally include or comprise at least one of the devices, components, modules and the like already cited elsewhere in the present description.

At least one embodiment of the MRT system may furthermore comprise a storage medium, i.e. a data memory, which contains a program code that codes or represents the method steps of at least one embodiment of the inventive method. The MRT system, in particular the control device for example, may also comprise a processor device which is configured to execute the program code in order to carry out at least one embodiment of the inventive method.

At least one embodiment of the inventive method serves to operate at least one embodiment of the inventive MRT system. In the method, the control signal is generated via the regulator device as a function of the difference between the predefined current setpoint value and the current actual value tapped at the output side of the switch-mode output stage and output to the limiter stage. A current limit setting is specified for the limiter stage via the control device. The control signal is limited via the limiter stage in accordance with the current limiter stage and the limited control signal is output to the modulator or forwarded to a modulation unit of the modulator. The latter can be the case in particular when the limiter stage is part of the modulator. The at least one modulator signal is generated via the modulator as a function of the limited control signal and transmitted to the switch-mode output stage. The pulse width modulation for the switch-mode output stage is specified by way of the modulator signal in order to provide the voltage for the gradient coil, the voltage provided by the switch-mode output stage also being limited—at least indirectly—by way of the limit setting. Patient safety is ensured by the control path integrated into the drive path of the MRT system and in particular by the corresponding monitoring device(s) of components of the control path.

At least one embodiment is directed to a circuit arrangement of a system, comprising:
a gradient coil;
a gradient amplifier, the gradient amplifier including
a switch-mode output stage to provide a voltage for the gradient coil at an output of the switch-mode output stage,
a regulator device to regulate a current for the gradient coil based upon a current setpoint value and a current actual value, tappable on an output side of the switch-mode output stage, and
a modulator, electrically connected between the regulator device and the switch-mode output stage, to generate a modulator signal for driving the switch-mode output stage, the modulator signal specifying a pulse width modulation for the switch-mode output stage based upon a control signal output by the regulator device; and
a circuit arrangement, to drive the gradient coil to ensure patient safety, a control path being integrated into a drive path of the circuit arrangement, the control path including
a limiter stage, connected downstream of the regulator device, the modulator, the switch-mode output stage, and the supply voltage, wherein the limiter stage is connected between the regulator device and an input of the modulator, the limiter stage being configured to limit the control signal and being configured to limit a voltage provided by the switch-mode output stage.

At least one embodiment is directed to a method for an MRT system, comprising:
generating a control signal, via a regulator device of the MRT system, as a function of a difference between a current setpoint value and a current actual value, the current actual value being tapped on an output side of a switch-mode output stage of the MRT system and being output to a limiter stage of the MRT system;
defining a current limit setting for the limiter stage, via a control device of the MRT system;
limiting the control signal in accordance with the current limit setting defined, and outputting a limited control signal to a modulator of the MRT system, via the limiter stage;
generating a modulator signal, via the modulator, as a function of the limited control signal; and
specifying a pulse width modulation, for the switch-mode output stage, by the modulator signal to provide a voltage for a gradient coil of the MRT system, wherein a supply voltage of the switch-mode output stage is limited by the current limit setting.

BRIEF DESCRIPTION OF THE DRAWINGS

Further features, details and advantages of the present invention will become apparent from the following description of preferred example embodiments, as well as with reference to the drawings, in which.

DETAILED DESCRIPTION OF THE EXAMPLE EMBODIMENTS

Figure 1:
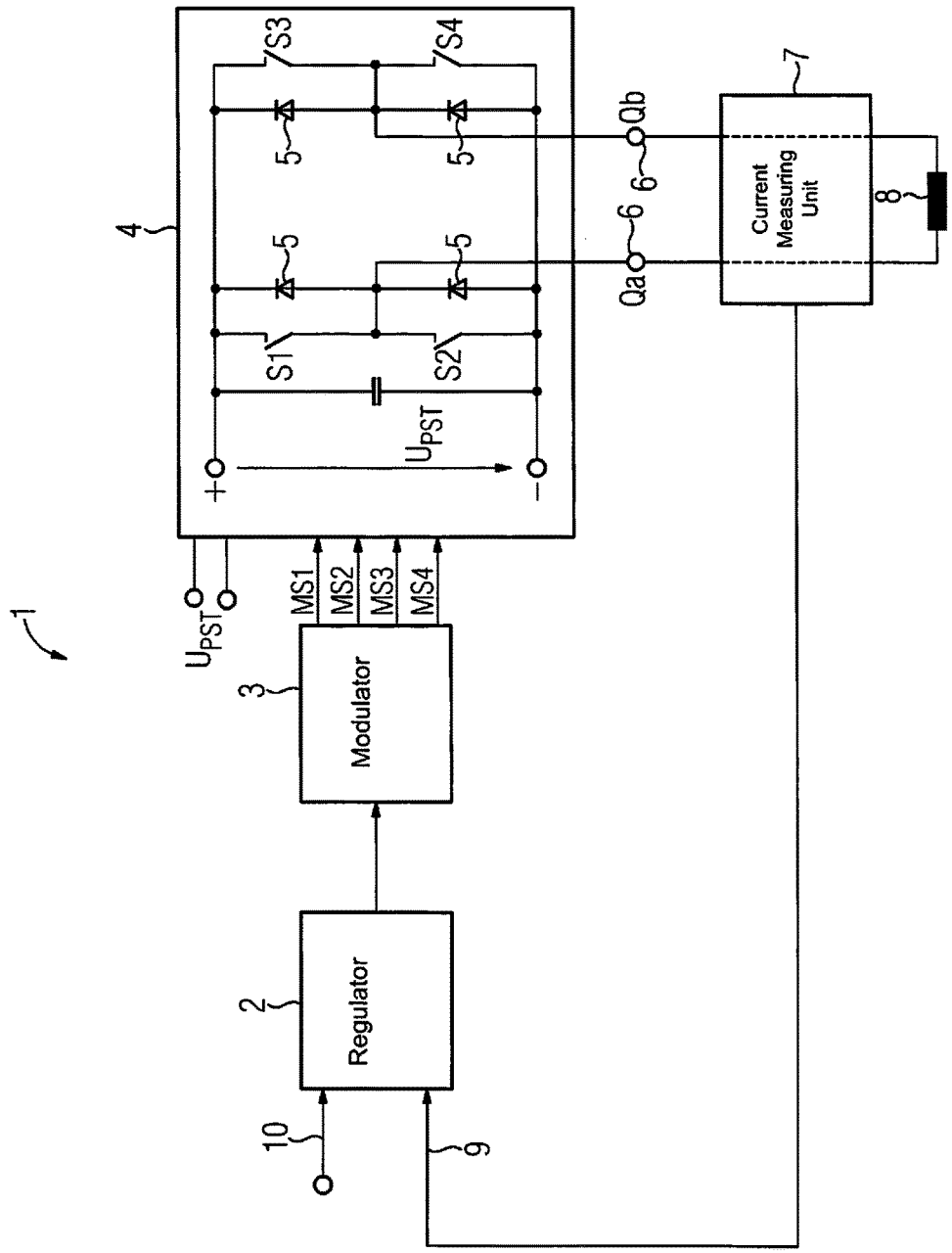
FIG. 1 shows a schematic of a gradient amplifier for an MRT system.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes;

etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Most of the aforementioned components, in particular the identification unit, can be implemented in full or in part in the form of software modules in a processor of a suitable control device or of a processing system. An implementation largely in software has the advantage that even control devices and/or processing systems already in use can be easily upgraded by a software update in order to work in the manner according to at least one embodiment of the invention.

At least one embodiment of the invention is directed to a circuit arrangement comprising a gradient amplifier and may be provided, i.e. embodied or configured, in particular for use or deployment in an MRT system, in particular in an MRT system according to at least one embodiment of the invention. The gradient amplifier comprises a switch-mode output stage, a regulator device and a modulator. The switch-mode output stage is configured to provide a voltage for a gradient coil of the MRT system at an output of the switch-mode output stage. The voltage is therefore provided at the output, while the gradient coil can be electrically connected directly or indirectly, i.e. without or with intermediary elements, to the output. In this configuration, multiple, in particular three, gradient coils can be connected accordingly, i.e. supplied with the or a respective voltage. Depending on requirements or on the embodiment of the MRT system, the gradient amplifier can therefore provide one or more voltages at one or more outputs of the switch-mode output stage. A plurality of gradient amplifiers may also be employed in the MRT system.

The regulator device, in an embodiment, is configured to regulate a current for the gradient coil on the basis of a predefined current setpoint value and a current actual value that is tappable or tapped, i.e. measured or present, on the output side of the switch-mode output stage, i.e. for example at the output of the switch-mode output stage. The current actual value therefore serves here as a controlled variable, while the current setpoint value serves as a reference variable. A difference between the current setpoint value and the current actual value serves as a control deviation or error variable, as a function of which a control signal can be or is generated by the regulator device. The modulator is electrically connected into the circuit between the regulator device and the switch-mode output stage. Thus, an output of the regulator device can simultaneously form an input of the modulator.

The modulator is configured to generate at least one modulator signal for driving the switch-mode output stage on the basis of the control signal output by the regulator device. The modulator signal in this case specifies a pulse width modulation for the switch-mode output stage. The switch-mode output stage may comprise multiple, for example four, switches or switching devices. The modulator can then generate a respective modulator signal for each switch or switching device of the switch-mode output stage. The modulator can therefore drive the switch-mode output stage or its switches or switching devices for example via four modulator signals in order to generate the voltage, i.e. a corresponding wanted or specified voltage value, at the output.

The current setpoint value can be provided or specified for example by or via a controller or a control device of the MRT system.

In order to ensure patient safety, a control path is integrated into a drive path of the circuit arrangement, i.e. also of the MRT system, provided for energizing or driving the gradient coil by way of the voltage output by the switch-mode output stage. The control path is therefore safely switchable in the interests of patient safety. The control path comprises a limiter stage or limiting circuit connected downstream of the regulator device, the modulator, in particular including the modulator signal output by the latter, the switch-mode output stage, in particular including its output or the voltage present there, and a supply voltage of the switch-mode output stage, as well as, advantageously, corresponding monitoring device(s). A monitoring device or respective monitoring devices can therefore be provided for monitoring a respective function of the limiter stage, the modulator, the switch-mode output stage and its supply voltage, as a result of which the safety of the control path, i.e. patient safety, can be improved.

In this arrangement the limiter stage is connected into the circuit on the input side of the modulator between the regulator device and an output of the modulator at which the modulator signal is output to the switch-mode output stage, or between the regulator device and an input of the modulator. The former may be the case when the limiter stage is part of the modulator, while the latter may be the case when the limiter stage is embodied as an independent component. The limiter stage is configured to limit the control signal and consequently also the voltage provided for the gradient coil by the switch-mode output stage. The limiting can be accomplished in this case by a specific, for example predefined, limit or limit setting of the limiter stage. At a maximum, therefore, a signal corresponding to the respective limit setting is output or forwarded by the limiter stage to a modulation unit of the modulator. The limit setting can correspond to a specific modulation index, for example. The limiter stage can be embodied as a separate structural element or component or for example be integrated into the modulator.

As a result of the described layout, i.e. the circuit arrangement according to at least one embodiment of the invention, the control path can be operated safely, in particular deactivated or shut down, in the interests of patient safety, which, in the case of a full drive route or drive path of the MRT system explained further below, appears virtually impossible, but would be associated at least with a significantly higher outlay of resources. By integrating or embedding the safe control path into the drive path of the MRT system it is advantageously possible to use some components, belonging for example to the gradient amplifier, without redundancy, i.e. without a duplicated configuration. These may include for example a current measuring unit for measuring or sensing the current actual value, a stimulation monitor and a shutdown route in a protect path.

The protect path of the MRT system can comprise the current measuring unit, i.e. a current sensor for the coil current, the current actual value or a device for generating the current actual value from a measured signal of the current measuring unit, a transmission path of the current actual value to an evaluation device or monitoring device of the MRT system, and a shutdown path from the monitoring device to a monitoring element of the gradient amplifier, and end at an output driver of the modulator.

Advantageously, therefore, the safety requirements for the MRT system can be subdivided into two completely different paths which do not or must not overlap functionally, namely the control path and the completely differently functioning protect path. This advantageously means that important parts of the MRT system do not have to be developed from scratch and there is no necessity to duplicate a protection monitoring and protection shutdown device(s). Advantageously, this also results in a simple and cost-effective possibility of upgrading existing MRT systems. Furthermore, because the control path is integrated into the drive path, no or only negligibly low additional costs are incurred compared to an unprotected MRT system.

Via the circuit arrangement according to at least one embodiment of the invention it is advantageously possible to limit a pulse edge that is too steep with regard to ensuring patient safety to a safe level for any errors or faults occurring upstream of the modulator. An excessively steep pulse edge can lead to values that are unsafe for the patient and/or his or her implant, i.e. values exceeding a specific predefined safety limit value, in respect of a temporal change or rate of change of the gradient and/or of the magnetic field or of a corresponding magnetic flux density B. Potential errors that may occur upstream of the modulator and jeopardize the safety of the patient and/or of the implant include for example an incorrectly chosen measurement sequence, a calculation error in a part of the system controller associated with the sequence generation, a transmission of an incorrect current setpoint value, a control circuit of the gradient amplifier oscillating due to an incorrect or erroneous setting of the regulator device, a failure of the control circuit or a failure of the current actual value or its provisioning or transmission. A fault occurring after or downstream of the modulator can in fact signify, with a high degree of probability, a destruction of the switch-mode output stage, for example due to a short circuit, which leads to a failure of the MRT system, though ultimately also to a safe state for the patient.

A further advantage of the circuit arrangement according to at least one embodiment of the invention is that no shutdown of the gradient amplifier is initiated, but rather the voltage is limited to a predefined maximum edge steepness, i.e. a limit is set for a corresponding voltage signal present at the output of the switch-mode output stage, and consequently for the corresponding signals or fields of the gradient coil and their changes. In the event of a shutdown, an image of the patient currently to be acquired in each case would inevitably be lost, with the result that the respective measurement sequence would have to restarted, possibly with a changed setting or modified parameters.

Particularly advantageously in the present case—in contrast to the prior art cited in the introduction—two switches of the switch-mode output stage can for example be opened or turned off in an unclocked manner directly by way of a soft-stop signal. A further current rise is advantageously prevented thereby even in the event of a clock failure.

A gradient amplifier within the meaning of at least one embodiment of the present invention may also be customarily referred to in the art as a GPA. A combination of a number of single amplifiers that may be arranged for example in a common switchgear cabinet may also be meant by this. A single amplifier can be associated with a channel in each case. Each of the single amplifiers can be shut down individually, for service or maintenance purposes, for example. Preferably, however, it is provided that—for example in the event of a shutdown due to the respective limit setting being exceeded and/or due to a fault—all the single amplifiers are switched, i.e. turned on or turned off or blocked, collectively, in particular synchronized with one another, i.e. for instance by way of the shutdown path or on the shutdown path of the MRT system. In this case the gradient coil can be an individual coil or representatively denote a coil array comprising a plurality of subcoils and/or channels. The subcoils can be arranged in a common enclosure. The subcoils can be connected, in particular mechanically, therein, but electrically insulated from one another. A channel—corresponding to the three spatial directions—can be assigned to one subcoil each. The modulator within the meaning of the present invention can be for example an FPGA, which generates the modulation for the switch-mode output stage or for a plurality of switch-mode output stages, of which one each may be assigned to one of the channels. A triangular signal or multiple, for example five, phase-shifted triangular signals may be used for this, for example. Some or all of the respective limiter stages and respective calculation units—described in more detail elsewhere in the present case—may be integrated in the FPGA, i.e. in the modulator. Complex combinations or arrangements composed of a plurality of components are therefore possible in principle. However, for clarity of illustration reasons, the present invention is described without limitation with reference to a single gradient amplifier.

Generally, a measurement sequence and its possible settings are developed or specified in such a way that a functional range, set out for example on the basis of the permitted maximum edge steepness, although utilized to the full, is not exceeded or departed from. Instances of exceeding the maximum edge steepness, even in an unlimited mode of operation, may nevertheless occur. This may be the case, for example, when a line voltage, i.e. for instance the supply voltage of the switch-mode output stage, deviates from an expected nominal value such that, for example, an undervoltage is present, in particular when this occurs in combination with specific settings, for example a specific minimum slice thickness, and an image plane freely tilted in space occurs. In such a case, gradient functions, i.e. functions of the gradient coil, such as, say, a slice selection, a phase encoding sequence and a readout gradient, are formed by overlaying from, for example, three spatial gradients of the magnetic field or the magnetic flux density in the x, y and z directions. The phase encoder typically has its greatest amplitudes at the start and end of a measurement sequence, such that an exceeding of the maximum edge steepness will occur mainly at the start and toward the end of the respective measurement sequence. It is often the case here that no error is detectable in the image generated at any given time. This may be due for example to the fact that important information or data for the image is obtained at relatively small phase encoding levels or amplitudes. Another reason may be that a PI control circuit of the gradient amplifier clearly notices, by way of its I component, a missing part of the edge and responds with a corresponding raising of a respective pulse of the measurement sequence such that an integral over the generated pulse as a whole can at least to a large extent correspond to an integral over a pulse nominally provided according to the respective drive action.

The limiting or restricting, i.e. the limiter stage, therefore exhibits a benign behavior and is able at least to a small degree to tolerate errors or even, with the aid of the PI controller or the regulator device, to equalize or compensate for the same. For the sequence development, this means that the circuit arrangement according to at least one embodiment of the invention advantageously permits predefined functional ranges or limit settings to be utilized to a greater extent, whereas in the case of a conventional shutdown safety monitoring device(s) a clearance from a respective limit or a respective shutdown threshold must be observed in order to avoid an excessively great risk of shutdown and consequently of the loss of respective image data. It is also particularly advantageous in this case that, as a result of the presently provided limiter stage, an otherwise potentially problematic response speed is not relevant and therefore does not need to be taken into account in a configuration because the limiting acts in advance, i.e. before the drive activation of the switch-mode output stage. A shutdown safety monitoring device(s), on the other hand, must first detect an exceeding of a predefined safety limit value, for example the rate of change of the magnetic flux density or of the gradient, as a result of which an unwanted state has already occurred. With the shutdown safety monitoring device(s) it is furthermore necessary to react quickly enough in response to such a detection in order to prevent a further exceeding of the limit and consequently an endangering of the patient or the implant. These difficulties are advantageously avoided with the present circuit arrangement.

In particular in the case of an unregulated line voltage, the supply voltage of the switch-mode output stage may be dependent on a current, possibly fluctuating, value of the line voltage. Furthermore, the supply voltage of the switch-mode output stage may drop under load. If a permissible maximum voltage for the gradient coil or gradient coils has been determined for a specific implant, then a maximum grid overvoltage must be assumed when dimensioning a limit or a limit setting, i.e. corresponding safety limit values. For an actual measurement sequence, this can mean that, as a result of that alone, in the event of an assumed fluctuation of the line or supply voltage by +/−10%, roughly 20% of the performance or efficiency of the MRT system may be lost or be unable to be utilized.

The full drive path of the MRT system may comprise a data memory containing a database of predefined measurement sequences, a selection of one of the measurement sequences by the user, a parameterization of the measurement sequence by the user, for example with regard to a slice thickness and an orientation of an examination plane in space, a conversion into corresponding ideal values for the current setpoint value, one or more readout times and one or more field gradients via a control computer or a control device of the MRT system, a further processing of the data into control data valid, i.e. usable for the MRT system, including for example a scaling of the ideal values according to a previously determined sensitivity of the gradient coil, an inclusion of a shim offset into the gradients in order to homogenize a main field of a magnet of the MRT system, an inclusion of an eddy current compensation, a transmission of the respective setpoint values to the gradient amplifier, and the regulating of the gradient or coil current via a regulator setting determined in advance. It is hardly possible to fully protect this complex and complicated complete drive route in the interests of functional safety and in the interests of patient safety, i.e. to design it to be completely safe, at a cost that is reasonable or financially viable.

A risk to the patient and the implant may consist in an overly rapid magnetic field deviation, i.e. an unduly great rate of change in the magnetic flux density dB/dt. Such an excessively great rate of change within a coil, the gradient coil for example, is only possible due to a correspondingly high voltage at the coil, or generally at a corresponding inductance. Conversely, this means that the rate of change, i.e. a slew rate of the field deviation, can be limited to a safe value if the voltage at the gradient coil is limited accordingly, i.e. is limited for example by way of the limiter stage to a predefined threshold or maximum value.

Disregarding an ohmic resistance of the gradient coil, the following applies $$U = L \cdot dI/dt \sim d\Phi/dt \sim dB/dt,$$

where U specifies the voltage at the gradient coil, i.e. for example the voltage at the output of the switch-mode output stage, also referred to as the output voltage, L the inductance of the gradient coil, $\Phi$ the magnetic flux, $B \sim \Phi/A$ the magnetic flux density for a surface area A through which the magnetic flux $\Phi$ penetrates at the site of the gradient coil, and t the time. The symbol $\sim$ is to be understood in this context in the sense of a proportionality. A change in the flux density B per distance covered specifies the gradient G.

In order to change the flux density dB/dt, a permitted or permissible maximum value $dB/dt_{max}$ may be specified for a respective implant. This specification is made in accordance with the technical consideration that a voltage induced in a coil array, for example in a wired implant, is proportional to a rate of change of the magnetic flux going through the coil array. An exceeding of the maximum value $dB/dt_{max}$ means that at the site of the implant or in the implant there is induced a voltage which can lead to a malfunction or to the failure of the implant. In addition or alternatively to the maximum value, a permissible maximum root mean square value $dB/dt_{RMS}$ (RMS=Root Mean Square) may be specified or predefined. This is based on the consideration that a current flow is induced in a conducting area, for example an enclosure of the implant, due to a change in the magnetic field acting at the site of the implant. Due to an electrical resistance of the area, this current flow produces an input of power and consequently causes the implant, as well as indirectly a tissue of the patient surrounding the implant, to heat up.

By way of the root mean square value $dB/dt_{RMS}$, a value is specified or defined which for an indefinite length of time, i.e. acting over an arbitrary period of time, does not lead to an impermissible or harmful heating of the implant or of the tissue of the patient, i.e. does not result in an injury to the patient. In addition, a time constant T can be specified in order to characterize a heating curve, i.e. a development over time of a temperature of the implant or of the surrounding tissue. According to specification or intended purpose, the gradient may therefore generate or assume, for a predefined, relatively short time period, values which may be greater than the root mean square value $dB/dt_{RMS}$, but must be less than the maximum value $dB/dt_{max}$. However, time-averaged over a, by contrast, relatively long period of time, the permissible root mean square value $dB/dt_{RMS}$ must not be exceeded. Actual values can in this case be based on a corresponding standard (FPO B), for example may amount to T=6 minutes, $dB/dt_{max}$=100 T/s (Tesla per second) and $dB/dt_{RMS}$=56 T/s.

However, actual values or specifications for a respective maximum value $dB/dt_{max}$ are not always available for every implant. Converting a dB/dt specification into a permissible maximum voltage value at the gradient coil requires knowledge concerning a field distribution of the gradient coil. For this, it is necessary to know or discover that location in the gradient coil at which a maximum value is yielded by an overlaying of all acting magnetic fields, for example a gradient field in each of the x, y and z directions. For optimal efficiency in the determining of the location, locations or spatial regions at which the implant, according to its intended purpose, cannot be situated, can be ruled out. It can subsequently be determined which proportion of the resulting maximum value, i.e. the maximum magnetic field or the corresponding magnetic flux density B, each of the three gradient fields or each of the three gradients has at the determined site of maximum field deviation, for example according to $$B=k_1=G_X+k_2\cdot G_Y+k_3\cdot G_Z$$

with respective coefficients $k_1$, $k_2$, $k_3$ for each spatial direction.

A particularly accurate determination of the proportions can be achieved if respective field directions of the absolute values |B(X)|, |B(Y)|, |BM(Z)| are vectorially added in order to obtain the total flux density B present. An apportionment that is particularly favorable for the operation of the MRT system is achieved if the three proportions or gradient fields as well as the corresponding achievable or achieved slew rates are at least substantially equal.

The definition or specification of the dB/dt values is particularly advantageous because they are based on technical considerations and for example a respective manufacturer of the implant can generate the corresponding magnetic fields and rates of change relatively easily via a simple test or trial coil in order to test the implant. Accordingly, the limit setting for the limiter stage can therefore then be specified particularly precisely and reliably in order both to ensure the safety of the patient and to make optimal use of the performance of the MRT system.

Equally, it is possible, for example on the part of the manufacturer of the implant, to define or specify at which maximum gradient slew rate per axis or direction the MRT system or the gradient coil or gradient coil array may be operated. Depending on implant, permissible maximum values may in this case lie for example in the range of 125 T/(m·s) or in the range of 200 T/(m·s). The specification T/(m·s) indicates the gradient per unit time and is to be understood as equivalent to the specification T/m/s customary in the art. In this case the corresponding values or specifications can advantageously refer to each of the three axes or spatial directions x, y and z and not to a single total slew rate resulting due to overlaying. The defined or specified values of the permissible maximum gradient slew rate can then advantageously be converted particularly easily into corresponding permissible maximum coil voltages even without knowledge of the field distribution of the gradient coil.

The sensitivity S of the gradient coil, i.e. the gradient that can be achieved by way of or as a function of a respective flowing current, can be determined or predefined for example by way of a corresponding specification during the development of the gradient coil or of the MRT system. The sensitivity is specified in gradients per ampere by way of the unit T/(m·A). The gradient is therefore specified in the unit T/m, and, included in the unit T/(m·A), it is also specified in this case which gradient per ampere coil current is achieved.

The following applies: $G=I\cdot S$ and slewrate$=G/T=(I\cdot S)/T$, where I specifies the gradient current, i.e. the current through the gradient coil. The result for a permissible maximum coil voltage is thus $U_{max}$=slewrate$_{max}\cdot L/S$.

Finally, a permissible maximum change in the coil current dI/dt can be derived from the specification or predefinition of the permissible maximum rate of change in the flux density $dB/dt_{max}$ or the permissible maximum gradient slew rate slewrate$_{max}$. By way of the relation $U=L\cdot dI/dt$ it is possible to determine therefrom in turn the permissible maximum coil voltage $U_{max}$. Based on or as a function of these variables, i.e. for example as a function of the permissible maximum change in the coil current $dI/dt_{max}$ and/or the permissible maximum coil voltage $U_{max}$, the limit setting of the limiter stage can be specified or chosen, i.e. adjusted.

In an advantageous embodiment of at least one embodiment of the present invention there is provided—as part of the circuit arrangement and/or as part of the MRT system—a protect path which comprises a current measuring unit arranged on the output side of the switch-mode output stage for the purpose of measuring the current actual value, a transmission path from the current measuring unit to a control device, and a shutdown path from the control device up to output drivers of the modulator which are provided for outputting the modulator signal to the switch-mode output stage. This advantageously enables the circuit arrangement and consequently also the MRT system to be designed safely in terms of patient safety. Particularly advantageously, the current measuring unit, i.e. the generation of the current actual value, can be part of the protect path, outside, i.e. not a constituent part, of the control path. A corresponding measured value of the current measuring unit or the current actual value resulting therefrom can therefore be evaluated and used as a controlled variable for the regulator device, without any requirement for an independently determined second current actual value. In this way the component requirements for the safe circuit arrangement and MRT system according to at least one embodiment of the invention are therefore minimized.

It is, however, important to be aware that the current actual value becomes part of the control path if effects on the control path that are dependent on the current actual value are compensated for. If the current actual value continues to be used in the protect path in such a case, then an additional safeguard and/or a redundant generation or provision of the current actual value or of the then independent second current actual value may be provided in order to ensure patient safety. Although this results in a requirement for additional components, it can nonetheless advantageously lead to a more precise control or controllability of the circuit arrangement or of the MRT system.

In an advantageous development of at least one embodiment of the present invention there is provided—for example as part of the circuit arrangement and/or as part of the MRT system—a control device which is connected to the limiter stage for the purpose of transmitting the limit setting to the limiter stage and reading out in each case a current limit setting from the limiter stage. The control device can therefore be electrically connected, i.e. coupled, directly or indirectly, in particular via a data link, to the limiter stage. The control device can serve for example as a central processing and/or administration center for the measurement sequences, for the parameters used for a respective measurement sequence, as well as for inputs and outputs via a connected user interface. This can advantageously facilitate or simplify an operability of the MRT system since the respective user is not required to interact with multiple prefabricated parts or components, i.e. in this case, for example, does not have to manually adjust the limiter stage separately. At the same time, safety can be further improved owing to the possibility of reading out the current limit setting.

In an advantageous development of at least one embodiment of the present invention, the limiter stage comprises a calculation unit for determining a root mean square value of the voltage, resulting for example from the modulator signal or the modulator signals, for the gradient coil or for at least one channel, preferably for three channels, of the gradient coil. In this case the calculation unit is configured for determining the root mean square value or the root mean square values on the basis of an output signal of the limiter stage and for adjusting the limit setting of the limiter stage as a function of at least one predefined first threshold value on the one hand and the root mean square value of one channel each on the other hand or a weighted sum of the root mean square values of the three channels. Advantageously, the calculation of the root mean square value can be performed via the calculation unit of the modulator and in addition via the control device or a monitoring component of the control device or generally of a system controller of the MRT system, in particular via a corresponding digital signal processor, thereby providing a double layer of safety as a result of this redundancy. In this case a channel can correspond to or be assigned to a spatial direction. The three channels can therefore specify a complete spatial description in three dimensions or spatial directions.

In an advantageous development of at least one embodiment of the present invention, the calculation unit of the modulator comprises a low-pass filter, in particular a first-order low-pass filter, and a first comparator for comparing an output signal of the low-pass filter with the first threshold value. The calculation unit or modulator is in this case configured to adjust the limit setting to a predefined reduced value lying below a predefined maximum value, preferably to 56% of the maximum value, when the first threshold value is reached. Via the first-order low-pass filter it is advantageously possible to map a heating curve which can describe or characterize the heating of the implant or the surrounding tissue, since in this case only a single, dominant time constant is relevant. The reduced value can for example correspond to the above-cited permissible root mean square value or be determined by the latter or as a function of the latter.

If the root mean square value is exceeded for a certain period of time during a measurement sequence, then, according to the heating curve modeled via the first-order low-pass filter, the first threshold value is reached after an actual, configuration-dependent time and the limit setting is thereupon adjusted to the reduced value. Since a measurement sequence does not consist exclusively of pulse edges, an actually present or acting value or time-averaged value, i.e. an actual root mean square value, will then fall below the maximum permissible root mean square value. This therefore advantageously enables the safety of the patient and of the implant to be ensured.

The limiter stage or modulator, in particular the calculation unit, can preferably be configured to readjust the limit setting subsequently, i.e. to increase it from the reduced value for example to the maximum value once more. This enabling or readjustment of the limit setting can for example be performed automatically when a predefined lower threshold value is reached. Accordingly, an oscillation of the limit setting between the maximum value and the reduced value or the lower threshold value can result. However, this is not an unsafe state, since the limiting predefined by way of the root mean square value is maintained on average over time.

In an advantageous development of at least one embodiment of the present invention, the calculation unit comprises a second comparator for comparing the output signal of the low-pass filter with a second threshold value that is less than the first threshold value. The calculation unit or modulator is in this case configured to enable the limit setting only if the output signal of the low-pass filter decreases to the second threshold value. In other words, the limit setting therefore cannot be increased again, for example raised to the maximum value, until a time interval determined by configuration of the second threshold value has expired. A difference between the first threshold value and the second threshold value can be interpreted or referred to as a hysteresis. Overall, it can advantageously be achieved in this way that the adjustment or switching of the limit setting oscillates about a value which lies below the root mean square value. As a result of the hysteresis, a number of switching operations occurring during the measurement sequence can advantageously be minimized and consequently an improvement in the longevity of the circuit arrangement also achieved in addition to the safeguarding of the safety of the patient and of the implant. The second threshold value can be for example 20% less than the first threshold value.

The modulator, in particular the calculation unit of the modulator, may comprise further components or switching elements. For example, a monoflop stage and a logical OR element may be provided, connected downstream of the two comparators. It can be ensured by this means that the reduced limit setting is actually retained or remains valid for a predefined minimum period of time. Preferably, the hysteresis and the minimum time can be adjusted, predefined or set as a function of the current measurement sequence at a given time or of a typical measurement sequence, in particular as a function of a corresponding execution time required for the current or typical measurement sequence, in such a way that a subsequent measurement sequence executed after the current measurement sequence can start with the maximum value of the limit setting.

Although a limiting to 56% of the permissible maximum value represents a significant limitation, the pulses of a measurement sequence are not necessarily required to make full use of the maximum value of 100% of the limit setting, i.e. a minimum limit. Thus, in spite of the intermittent significant limiting to, for example, 56%, the situation may arise that one or several of the last pulses are affected only at an end of the measurement sequence and the image generated by way of the sequence is nonetheless usable. If, however, the measurement sequence is totally unsuitable, for example due to a serious error, and therefore effects the limiting already at the start of the measurement sequence, i.e. an intervention by the protection mechanism provided by the limiter stage and the calculation unit, then corresponding image data may in certain circumstances be unusable.

In an advantageous development of at least one embodiment of the present invention, the gradient amplifier comprises a voltage feedback (VFB) circuit. The VFB circuit is configured to measure the supply voltage of the switch-mode output stage and to loop a correction signal determined as a function of the measured supply voltage into the electrical connection between the limiter stage and the modulator, in particular between the limiter stage and the modulation unit, which generates the actual pulse width modulation in the modulator. A product of a corresponding modulation index of the pulse width modulation and the supply voltage of the switch-mode output stage is kept at least substantially constant by this means for every constant control signal. Via a voltage feedback message from the supply voltage of the switch-mode output stage, the VFB circuit can therefore compensate for a change in the supply voltage by way of a corresponding change or adjustment or influencing of the modulation index or modulation deviation.

The greatest uncertainty to be taken into consideration in a dimensioning or adjustment of the limit setting in the case of a gradient amplifier with unregulated supply voltage of the switch-mode output stage is the line voltage. As described above, for example up to 20% of the performance or efficiency may be lost in this case compared to an ideal limit. This great gap can advantageously be eliminated via the VFB circuit in the gradient amplifier. When determining a suitable limit, i.e. when setting the limiter stage, it is then advantageously only necessary to take into account a tolerance or precision of the VFB circuit instead of the potential fluctuation of the line voltage, which can be significantly greater.

Using the VFB circuit affords a great advantage, in particular for the development of measurement sequences, since an undervoltage due to fluctuation of the line voltage or due to load no longer needs to be taken into account, but rather the output voltage of the switch-mode output stage can actually be achieved up to the limit predefined by the current limit setting. Advantageously, the control path becomes only marginally greater or more complex due to the VFB circuit. In a real layout, the regulator device and the modulator can for example form a first unit or module with a built-in receiver section of the VFB circuit, and the switch-mode output stage can form a second unit or module with a built-in transmitter unit of the VFB circuit. According to the number of components, the size or length of the control path remains unchanged in spite of the VFB circuit. In order to ensure patient safety, a device(s) of monitoring the VFB circuit should be provided since a fault or failure of the VFB circuit can lead to a considerable influencing of the limit setting.

At least one embodiment of the inventive MRT system comprises at least one embodiment of an inventive circuit arrangement, a control device connected to the circuit arrangement in order to specify the limit setting for the limiter stage and the current measuring unit arranged on the output side of the switch-mode output stage for the purpose of measuring the current actual value, the current measuring unit being electrically connected to the regulator device in order to transmit the current actual value to the regulator device. The control device may be in particular the control device already cited elsewhere. In addition, the MRT system may equally include or comprise at least one of the devices, components, modules and the like already cited elsewhere in the present description.

At least one embodiment of the MRT system may furthermore comprise a storage medium, i.e. a data memory, which contains a program code that codes or represents the method steps of at least one embodiment of the inventive method. The MRT system, in particular the control device for example, may also comprise a processor device which is configured to execute the program code in order to carry out at least one embodiment of the inventive method.

At least one embodiment of the inventive method serves to operate at least one embodiment of the inventive MRT system. In the method, the control signal is generated via the regulator device as a function of the difference between the predefined current setpoint value and the current actual value tapped at the output side of the switch-mode output stage and output to the limiter stage. A current limit setting is specified for the limiter stage via the control device. The control signal is limited via the limiter stage in accordance with the current limiter stage and the limited control signal is output to the modulator or forwarded to a modulation unit of the modulator. The latter can be the case in particular when the limiter stage is part of the modulator. The at least one modulator signal is generated via the modulator as a function of the limited control signal and transmitted to the switch-mode output stage. The pulse width modulation for the switch-mode output stage is specified by way of the modulator signal in order to provide the voltage for the gradient coil, the voltage provided by the switch-mode output stage also being limited—at least indirectly—by way of the limit setting. Patient safety is ensured by the control path integrated into the drive path of the MRT system and in particular by the corresponding monitoring device(s) of components of the control path.

In an advantageous development of the method according to at least one embodiment of the invention, the current actual value is transmitted to a monitoring device, which may be part of the control device, for example. In or via the monitoring device, it is determined on the basis of the transmitted current actual value whether a predefined maximum value for a temporal rate of change of a magnetic field generated via the MRT system, for example via the gradient coil, and/or a spatial magnetic field gradient generated via the gradient coil is exceeded. The gradient coil may therefore be in particular part of the MRT system. If the maximum value is exceeded, a turn-on signal is transmitted by the monitoring device to a monitoring element of the gradient amplifier. The modulator, in particular its modulation unit, is accordingly switched by the monitoring element into a freewheeling circuit and—preferably with a delay of less than 50 ms—a blocking of the output drivers of the modulator, which are provided for outputting the modulator signal to the switch-mode output stage, is initiated.

The monitoring device may for example be provided in any case in the MRT system, for example for monitoring with regard to a possible nerve stimulation. Should this monitoring device detect an exceeding of, for example, the permissible predefined maximum value for dB/dt and/or for dG/dt in spite of the safe configuration of the control path, then it can transmit the turn-on signal. The monitoring element of the gradient amplifier can then send a soft-stop signal in order to switch the modulator into the freewheeling circuit. The switch-mode output stage can clearly form a short circuit between the poles of its output by way of the soft-stop signal. A current or coil current flowing through the switch-mode output stage and the gradient coil at this moment is then dissipated by way of a voltage drop at an ohmic resistance of the gradient coil and corresponding electrical connections or cables. This happens passively and with an edge steepness that is nonhazardous in terms of the safety of the patient and of the implant. A few milliseconds later, the switch-mode output stage is blocked completely as a result of the blocking of the output driver. A residual current that is still then present can then be fed back into the supply voltage or the grid via freewheeling diodes of the switch-mode output stage that are connected in parallel with the switches or switching devices of the switch-mode output stage. Although this can result in a maximum voltage at the gradient coil, and consequently a maximum edge steepness, the small size or low strength of the residual current and of the magnetic field produced thereby means it cannot lead to any hazard for the patient or the implant.

The control path can operate with a predefined, for example permanently set, limit setting. However, it is equally possible for the control path, i.e. the components of the control path, to calculate the limit setting to be used in a particular case independently, for example from predefined parameters. It is possible to switch—manually or automatically—between these two possibilities or operating modes. Similarly, the control path, i.e. the components of the control path, can be switched over manually between different limit settings or their use and/or can switch over automatically. For example, after a new limit setting has been calculated or in the event of a limit setting differing from the previous limit, an automatic switchover can be effected from the previous limit setting in each case to the new, i.e. newly calculated, limit setting.

The characteristics and developments of the aspects of embodiments of the present invention, i.e. of embodiments of the inventive circuit arrangement, embodiments of the inventive MRT system and embodiments of the inventive method, disclosed heretofore and in the following, as well as the corresponding advantages, are in each case transferable analogously in a reciprocal manner between the aspects of embodiments of the present invention. This applies also to components and devices used or usable for carrying out embodiments of the inventive method. The invention therefore also encompasses such developments of the individual aspects of the invention which comprise embodiments that are not described herein explicitly in the respective combination, but are described for example only in connection with one of the aspects.

The example embodiments explained below are preferred embodiment variants of the invention. In the example embodiments, the described components of the embodiment variants in each case represent individual features of the invention which are to be considered independently of one another and which in each case also develop the invention independently of one another and therefore are also to be regarded as a constituent part of the invention individually or in a different combination from that shown. Furthermore, the described embodiment variants may also be supplemented by further of the already described features of the invention.

In the figures, like, functionally like or mutually equivalent elements are in each case designated by like reference signs.

FIG. 1 shows a schematic of a first gradient amplifier 1, as may be used for example in an MRT system. The first gradient amplifier 1 comprises in this case a controller or regulator device 2, a modulator 3 and a switch-mode output stage 4. An output of the regulator device 2 is connected to an input of the modulator 3. An output of the modulator 3 is connected to an input of the switch-mode output stage 4. The switch-mode output stage 4 is supplied with a supply voltage UPST from an electricity grid. Internally, the switch-mode output stage 4 in the present example comprises four switches S1, S2, S3, S4, which can be switched or driven by way of modulator signals MS1, MS2, MS3, MS4 generated by the modulator 3. The four switches S1 to S4 can form an H-bridge, for example. In response to a soft-stop signal or by way of a soft-stop signal, the switches S1, S3, for example, can then be turned on, i.e. closed, and the switches S2, S4 turned off, i.e. opened. Similarly, the switches S1, S3 can be turned off in response to a soft stop, for example, and the switches S2, S4 turned on.

In addition, the switch-mode output stage 4 internally comprises four freewheeling diodes 5, one each of which is connected in parallel with one each of the switches S1 to S4.

At an output 6, the switch-mode output stage 4 has two output contacts Qa, Qb at which an output voltage output or provided by the switch-mode output stage is present. The switch-mode output stage 4 is shown in this example as a single output stage, though it is equally possible to employ a plurality of series-connected partial output stages. In the present case a current measuring unit 7 is connected to the output 6 in order to measure or provide a current actual value 9. A gradient coil 8 is also connected to the output 6 via the current measuring unit 7. Thus, the output voltage of the switch-mode output stage 4 present at the output 6 simultaneously represents a coil voltage for the gradient coil 8.

The current actual value 9 is supplied to the regulator device 2 as a controlled variable. The current actual value 9 is compared by the regulator device 2 with a predefined or provided current setpoint value 10 which is supplied to the regulator device 2 as a reference variable. From a difference between the current actual value 9 and the current setpoint value 10, the regulator device 2 generates a control signal. From the control signal, the modulator 3 generates a pulse width modulation for the switches S1 to S4 of the switch-mode output stage 4. If a modulation index MG of ±100% is defined for the modulator 3, then at +100% the output contact Qa, for example, will be positive with respect to Qb and the output voltage will have the same level as the supply voltage UPST. At a modulation index of −100%, Qb will be positive with respect to Qa, the output voltage also having the same level in this case, i.e. being of the same magnitude in its absolute value as the supply voltage UPST. At a modulation index of 0%, the output voltage, i.e. the voltage between the output contacts Qa, Qb, will be zero. At a modulation index between −100% and +100%, the output voltage will be proportional to the modulation index. The result yielded for the level of the output voltage U at the output 6 is thus U=MG/100%·UPST. If the supply voltage UPST is regulated, then the output voltage is therefore yielded directly from the modulation index.

Figure 2:
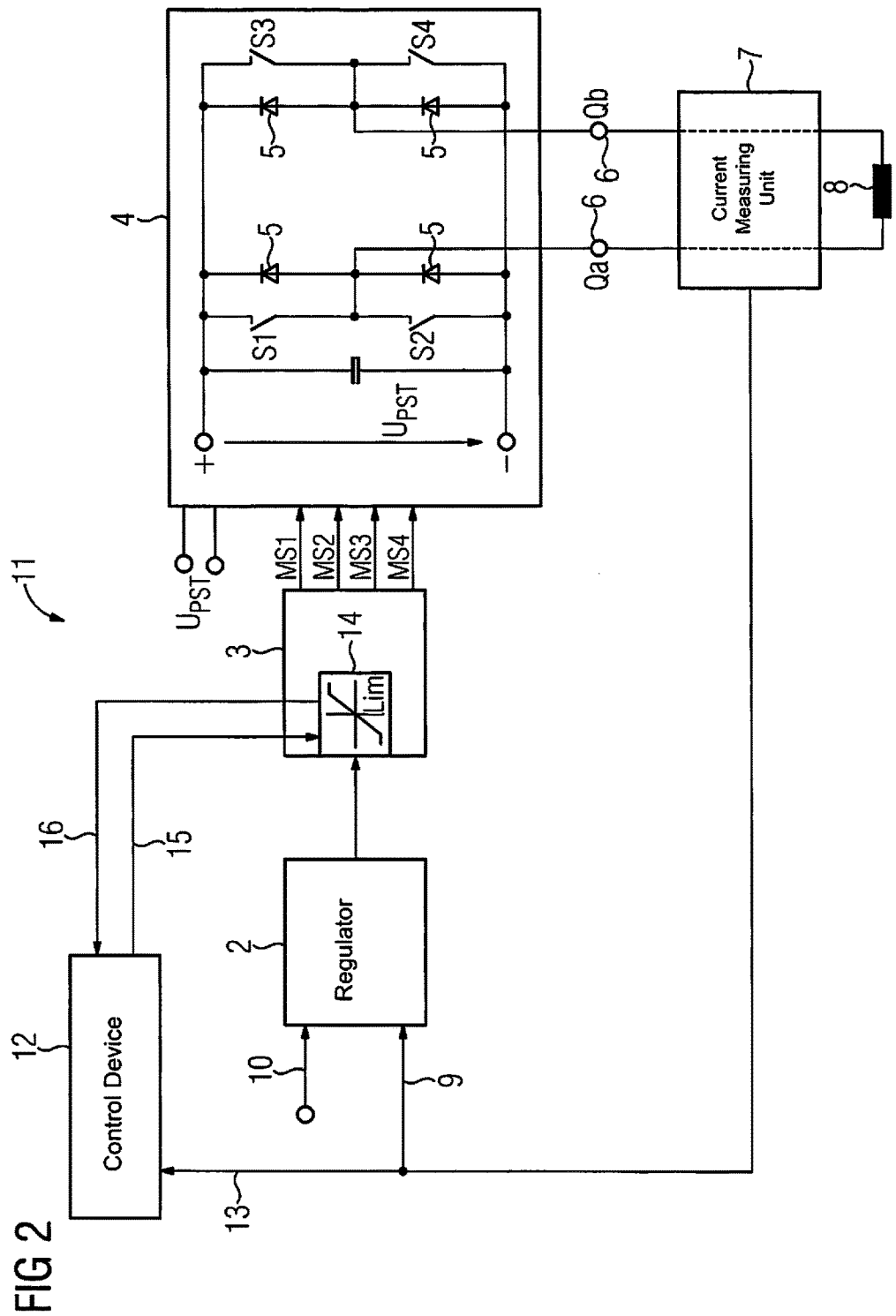
FIG. 2 shows a schematic of a gradient amplifier for an MRT system having a limiter stage.

FIG. 2 shows a schematic of a second gradient amplifier 11, which may be regarded as a development of the first gradient amplifier 1. The second gradient amplifier 11 additionally comprises a control device 12, which, just like the first gradient amplifier 1 or the second gradient amplifier 2, may be part of the MRT system. The control device 12 is to be understood in this case merely schematically as a component and may comprise or represent a plurality of different functions or functional units. For example, the control device 12 can provide the current setpoint value 10 to the regulator device 2.

In the arrangement shown in FIG. 2, it is provided that the current actual value 9 is also transmitted by the current measuring unit 7 via a transmission path 13 to the control device 12, in particular to a monitoring device of the control device 12. In addition, the second gradient amplifier 11 comprises a limiter stage 14, designated here as Lim. In the present example the limiter stage 14 is built into the input of the modulator 3 so that the control signal output by the regulator device 2 arrives at the limiter stage 14 in the first instance. The limiter stage 14 can restrict or limit the control signal in accordance with its limit setting before it is forwarded, for example to a further functional unit of the modulator 3. The limit setting or a value of the limit setting is also referred to here as limit for short.

In the present example, the limit setting for the limiter stage 14 can likewise be provided by the control device 12 via a transmission path 15. In addition, a limit setting currently present in the limiter stage 14 can be read out by the control device 12 via a transmission path 16.

The limit setting, which can vary in a range from −100% to +100%, causes the control signals processed further by the modulator 3 to be limited to a corresponding value. Consequently, the modulator signals MS1 to MS4 output by the modulator 3 to the switch-mode output stage 4 are also limited to a value limited by the current limit setting in each case. As a result, the output voltage of the switch-mode output stage 4 can then also not become greater than Limit/100%·UPST, where Limit specifies the current limit setting of the limiter stage 14.

Using the second gradient amplifier 11 in the MRT system therefore enables pulse edges to be limited via the limiter stage 14 or, as the case may be, the PWM limiting (PWM: Pulse Width Modulation) realized by the same in order, for example, not to put a patient, in particular a patient fitted with a metallic implant, at risk. It may advantageously be provided that a warning or an alert be output to a user of the MRT system when a pulse edge is limited, i.e. when the limiter stage 14 goes into action. By this means it can be ensured that the user can for example subject an image generated via the MRT system to particularly close scrutiny if a limiting has taken place during the acquisition of the image. Similarly, as a result of the alert or warning, the user can if necessary make targeted adjustments to a respective measurement sequence or corresponding parameters of the MRT system.

Figure 3:
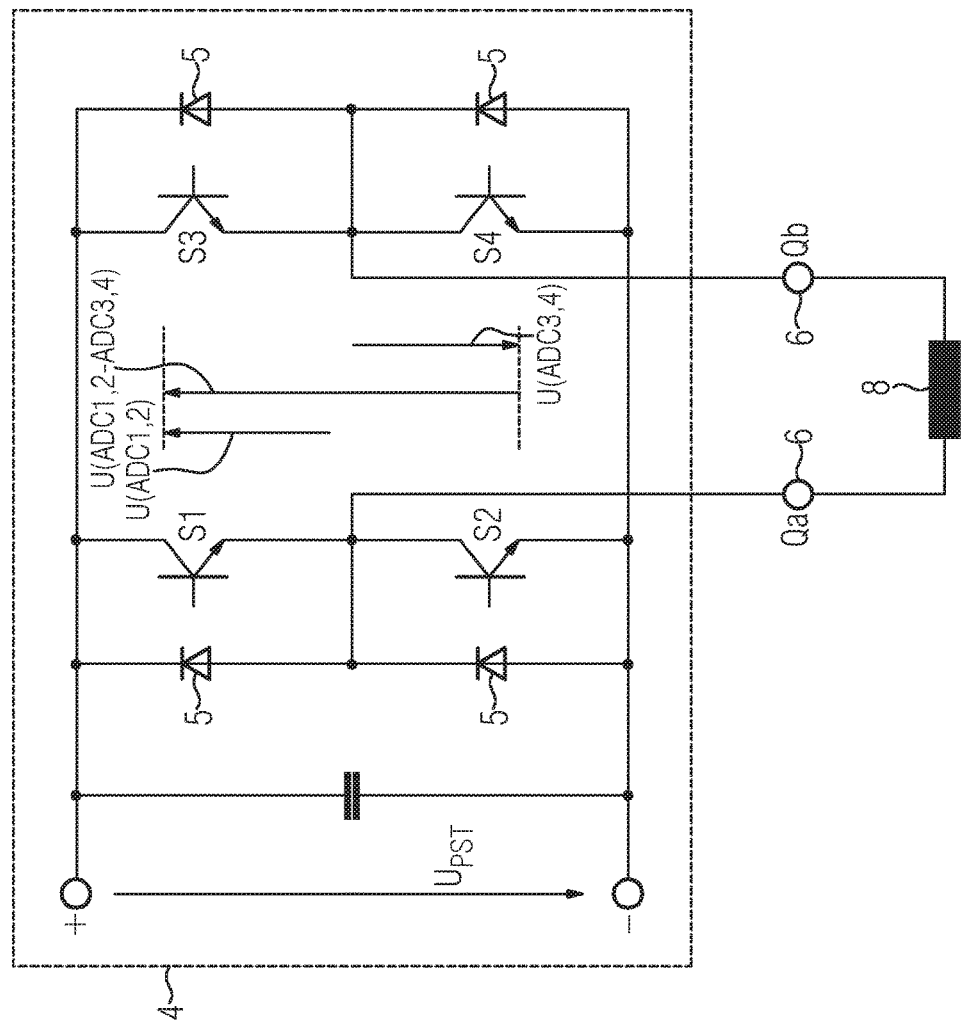
FIG. 3 shows a schematic intended to illustrate an example of a modulation control of a switch-mode output stage of a gradient amplifier for an MRT system.

FIG. 3 shows a schematic of a switch-mode output stage 4 in which the modulation control thereof by way of voltage signals of a modulator, the modulator 3, for example, is illustrated. The switch-mode output stage 4 may be for example the switch-mode output stage 4 of the MRT system cited in connection with the other figures. The signals of the modulator 3 can be generated for example via two analog-digital converters (AD converters, ADCs). A first of these AD converters can for example effect the modulation control of the switches S1 and S2 of the switch-mode output stage 4. This is illustrated in the present case by way of example by way of a voltage arrow U(ADC1,2). A second AD converter can for example—apart from dithering or an offset—receive an input signal inverted with respect to the first AD converter and accordingly effect the modulation control of the switches S3 and S4 of the switch-mode output stage 4. This is illustrated here by way of example by way of a second voltage arrow U(ADC3,4). The output voltage of the switch-mode output stage 4 at its output 6 is then yielded from a difference between the two modulation controls or voltage arrows, which is illustrated here by way of example by way of a long third voltage arrow U(ADC1,2-ADC3,4).

Figure 4:
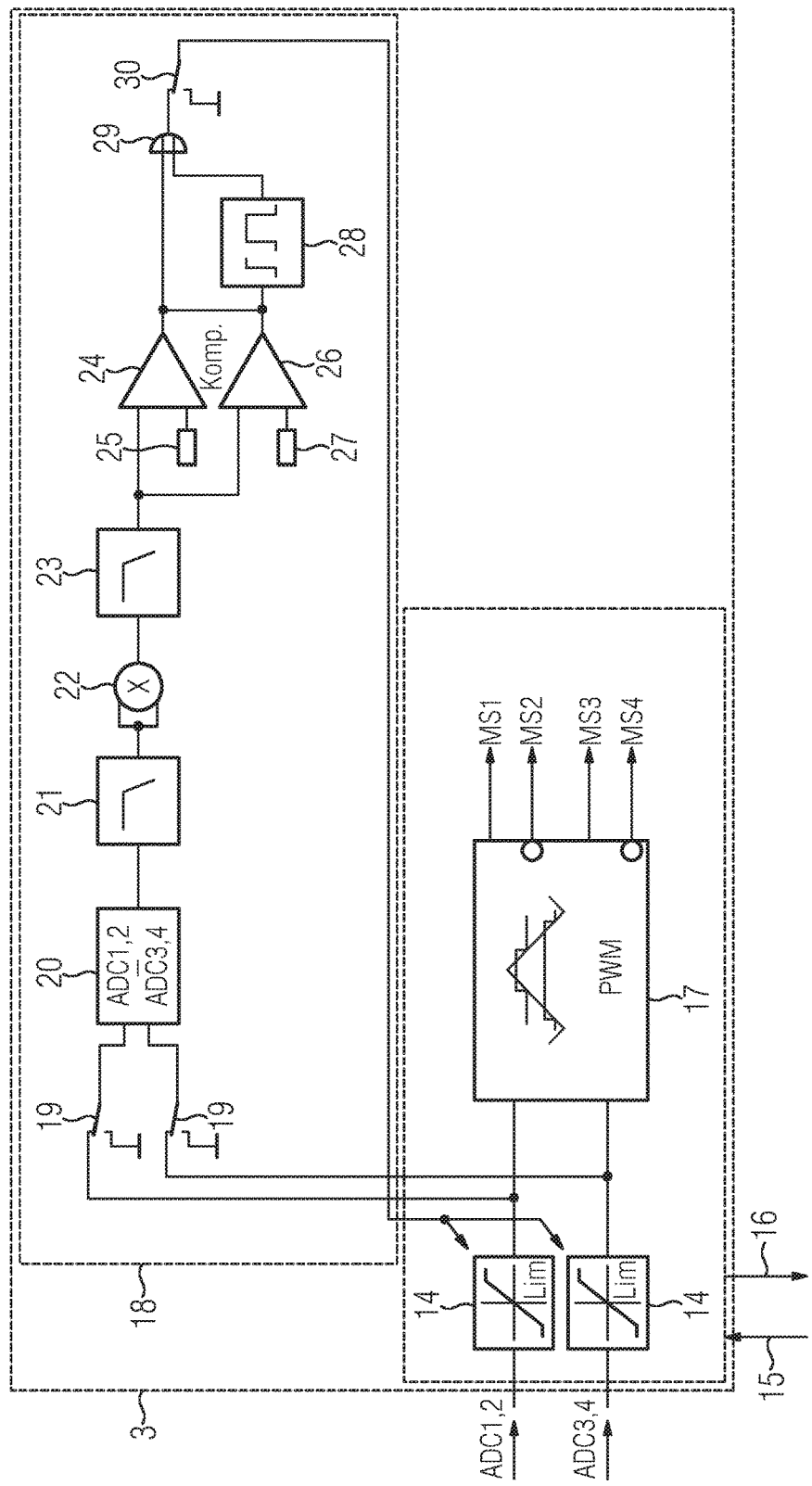
FIG. 4 shows a schematic of a modulator expanded by a calculation unit for a gradient amplifier of an MRT system.

FIG. 4 shows a schematic of a modulator 3 which, or the limiter stage 14 of which, is expanded by an example calculation unit 18. The modulator 3 illustrated here may be for example the modulator 3 of the MRT system cited in connection with the other figures. The modulator 3 may for example be combined with a premodulator for offset staggering and/or dithering and therefore in this example has two inputs, designated by ADC1,2 and ADC3,4.

The calculation unit 18 serves for calculating or determining the limit setting, i.e. the limit for the limiter stage 14. In the present example, the limiter stage 14 is in this case designed in two parts. One part each is connected to one of the two inputs so that signals entering via both inputs can be limited via the limiting unit 14. It may be possible to switch over between the specification of the limit setting predefined via the control device 12 as described in connection with FIG. 2 and the calculation of the limit setting or limit settings via the calculation unit 18.

The calculation unit 18 calculates the respective limit setting or a root mean square value that is to be maintained on average over time on the basis of the input signals entering via the two inputs, which signals may be in particular control signals of the regulator device 2.

In this case the input signals first pass through the limiter stage 14 and are thus limited according to the current limit setting to a specific value or a specific level. The limit setting or limit settings may be dimensioned in particular for three channels, each corresponding to one of the spatial directions x, y, z, such that each corresponding channel or gradient channel can contribute only its allocated portion to a maximum rate of change $dB/dt_{max}$ in the flux density generated by the gradient coil 8. Accordingly, the input signals can be limited for each channel independently to a value assigned to the respective channel. Instead of a single value, the limit setting may therefore comprise multiple, in particular three, values or limits, of which each is assigned to or associated with one channel or one spatial direction in each case.

The limited or restricted input signals proceed from the limiter stage 14 on the one side to a modulation unit 17 of the modulator 4, which unit generates therefrom the modulator signals MS1 to MS4, i.e. the actual pulse width modulation for the switch-mode output stage 4 connected downstream of the modulator 3. On the other side, the limited or restricted input signals reach the calculation unit 18. If the limit or root mean square value calculation is activated, respective first switches 19 of the calculation unit 18 are disposed in the closed position shown here so that the input signals can continue onward to a differentiator 20. The corresponding connection is interrupted by switching over the first switches 19, i.e. the calculation is deactivated via the calculation unit 18.

The differentiator 20 generates the difference between the two input signals. This difference may finally correspond to the output voltage of the switch-mode output stage 4 (cf. also FIG. 3 U(ADC 1,2-ADC3,4)).

From the differentiator 20, the latter's output signal reaches a first low-pass filter 21, which is a higher-order low-pass filter. The first low-pass filter 21 may be realized for example as a second-order Bessel low-pass filter with $f_G$-3 dB at 10 to 15 kHz, where $f_G$ specifies the cutoff frequency of the first low-pass filter 21. A switching ripple of the output signal of the differentiator 20 can be reduced via the first low-pass filter 21. Even if it may be standard practice to permit a cutoff frequency of 5 kHz, for example, it may be advantageous in terms of patient safety to choose a value of more than 10 kHz for the cutoff frequency since otherwise, given currently possible gradient rates of change, an unduly large portion of a usable wanted signal would be suppressed.

An output signal of the first low-pass filter 21 then arrives at a multiplier 22, in which it is multiplied by itself, i.e. squared. The squared signal then arrives at a second low-pass filter 23, which is a first-order low-pass filter. The second low-pass filter 23 can have a time constant of $T \leq 1$ min, for example, which can therefore be much less than a time constant of 6 minutes provided as standard. The second first-order low-pass filter 23 very effectively maps a natural heating curve in which there is only one dominant time constant and which can characterize a heating behavior of, for example, an implant or surrounding tissue, caused, for example, by an effect of a magnetic field such as, say, the field generated by the gradient coil.

An output signal of the second low-pass filter 23 passes into a first comparator 24, in which it is compared with a predefined first threshold value 25. If the output signal of the second low-pass filter 23 reaches the first threshold value 25, the limit setting of the limiter stage 14 can be adjusted or converted, for example to 56% of a predefined maximum value. The maximum value can amount to 100 T/s, for example. Of this, 56%, i.e. roughly 56 T/s, can be provided or predefined as a permanently permissible quadratic mean or RMS value. The input signals entering the modulator 3 would therefore be limited in that event to the root mean square value that is permissible for a continuous mode of operation or as an average over time. The first threshold value 25 may for example be determined as 2.56% of the permissible maximum value squared. A terminal value achievable by the second low-pass filter 23 if no switchover of the limiter stage 14 occurs, i.e. the limit setting were not adjusted, could, on the other hand, be 2.100% of the maximum value squared. The factor 2 is due here to the difference generated via the differentiator 20.

If the input signals reaching the modulator 3 during a measurement sequence were persistently to exceed the permanently permissible root mean square value, then, when the output signal of the second low-pass filter 23 has reached the first threshold value 25, the limit setting, i.e. the limit of the limiter stage 14, will accordingly be lowered to the permissible root mean square value. Since a measurement sequence does not permanently consist only of pulse edges, the actual root mean square value is now less than the limit specified by the adjusted limit setting, whereupon the limit setting would be set once again to the permissible maximum value, i.e. to 100%, by the first comparator 24. For the limit setting, this would result in a continuous oscillation between the maximum value and the lowered value. However, it may be undesirable for the oscillation to take place specifically in the case of the predefined permissible root mean square value.

In the present example, a second comparator 26 is therefore provided which compares the output signal of the second low-pass filter 23 with a predefined second threshold value 27. In this case the second threshold value 27 is less than the first threshold value 25, by 10 to 30%, for example. As illustrated in the figure, a monoflop stage 28 and an OR gate 29 are connected downstream of the comparators 24, 26. In this case the OR gate 29 is supplied with an output signal from the comparators 24, 26 at one of its inputs and with an output signal from the monoflop stage 28 at its other input. The second comparator 26 does not enable the limit setting to be adjusted or switched over until the output signal of the second low-pass filter 23 has decreased by the difference between the predefined threshold values 25, 27, with the result that the limit can only then be raised to the maximum value of 100% once more. The limit or, as the case may be, its switchover or adjustment now oscillates or swings about a value that lies below the predefined permanently permissible root mean square value. A further effect is that the lowered limit setting is retained at least for a certain length of time which is dependent on a concrete configuration of the components, and is not immediately raised to the maximum value again.

Since an average value over time or a root mean square value for a thermal loading is relevant to the safety of the patient and of the implant, a history recording the actual root mean square value must not be deleted or discarded. Advantageously, therefore, the output signal of the second low-pass filter 23, for example, cannot be set to zero selectively or manually, by way of a fault reset or the like, for example. The first switches 19 hold only the input signal of the calculation at zero. By this means it can be achieved for example that an unlimited mode of operation is not evaluated in addition.

The adjustment or switchover of the limit setting can be activated or permitted or deactivated or prevented via a second switch 30 connected downstream of the OR gate 29. Even after the first switches 19 have been opened, this can advantageously prevent any further change to the limit setting being made in an unwanted and/or uncontrolled manner.

Figure 5:
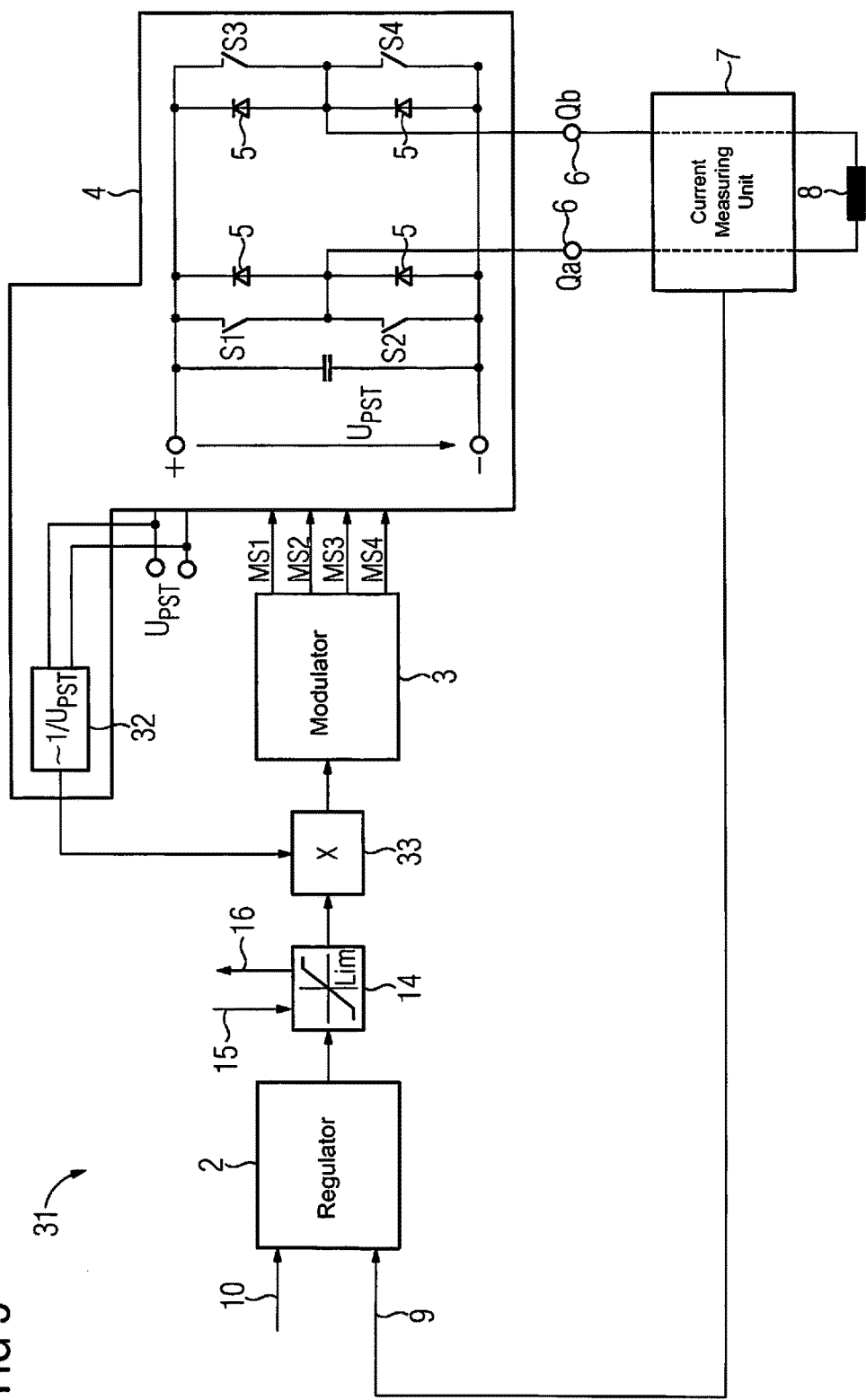
FIG. 5 shows a schematic of a gradient amplifier for an MRT system having a voltage feedback circuit.

FIG. 5 shows a schematic of a third gradient amplifier 31 in which a voltage feedback circuit (VFB circuit) comprising a VFB transmit unit 32 and a VFB receiver unit 33 is provided. For the modulator 3, it obtains that a specific modulation index is uniquely assigned to its input signal. However, the actual output voltage of the switch-mode output stage 4 is produced only from the modulation index in conjunction with an actual value of the supply voltage $U_{PST}$, which can vary in an uncontrolled manner as a function of fluctuations in line voltage. For this reason, the supply voltage $U_{PST}$, i.e. its actual value, is measured via the VFB transmit unit. A correction signal is generated from the measured value and transmitted to the VFB receiver unit 33. The correction signal is looped in between the regulator device 2 and the modulator 3, in particular after or downstream of the limiter stage 14, by the VFB receiver unit 33. The effect of looping in the correction signal is that the modulation index MG is changed such that the condition $MG \cdot U_{PST}$=const. is met. Advantageously, a specific output voltage of the switch-mode output stage 4 is then uniquely assigned to a control signal output by the regulator device 2 as a result.

Let a nominal value of the supply voltage, i.e. a nominal voltage of the switch-mode output stage 4, amount for example to 2000 V. At the nominal voltage of the switch-mode output stage 4, a specific control signal can produce a modulation index of 50%, for example, such that an output voltage of 50%·2000 V=1000 V is therefore generated at the output 6 of the switch-mode output stage 4. If the actual value of the supply voltage UPST now dips, for example due to a fluctuation in line voltage and/or a load, from the nominal value to, for example, 1500 V, then the modulation index is automatically increased to ≈66.67% via the VFB circuit. According to 66.67%·1500 V=1000 V, the output voltage then nonetheless remains constant, as long as the corresponding control signal does not change. If the limit setting for the limiter stage 14 is set to the corresponding value, then output voltages of −1000 V to +1000 V can therefore be reliably and safely achieved. Only if the actual value of the supply voltage UPST drops to below 1000 V will it then no longer be possible to generate or achieve an output voltage of 1000 V at the output 6.

A control path that is safe in terms of patient safety is provided in particular in the case of the gradient amplifiers 11, 31, which control path may be referred to on account of the relatively small number of components as a small control path. The control path starts at the limiter stage 14, comprises the modulator 3 along with its modulator signals MS1 to MS4, the switch-mode output stage 4 and its supply voltage UPST, and ends at the output 6 of the switch-mode output stage 4. The number of the components is therefore significantly lower than for example the number of components in a full drive path of the MRT system. As the MRT system may comprise the gradient amplifier 11, 31, the control path is integrated or embedded into the drive path of the MRT system. Neither the current measuring unit 7 nor the current actual value 9 is used for the control path, so the current actual value 9 may particularly advantageously be used for a protect path without jeopardizing patient safety and without any need to determine or generate an independent second current actual value 9.

However, if it is aimed to compensate for current-dependent tolerances, then information concerning the current actual value 9 is necessary. This requires an independent second current actual value to be generated for the protect path or demands that the existing current actual value 9 must never be allowed to fail unnoticed, which, realistically, is hardly possible to ensure.

Factors that are dependent on the current actual value 9 are a voltage drop at an ohmic resistance of a load connected to the output 6, a nonlinear voltage drop at semiconductor elements of the switch-mode output stage 4, for instance at the switches S1 to S4 thereof, as well their forward voltages and switching characteristics. These current-dependent tolerances can be taken into account by way of a parallel shift of respective upper or positive and lower or negative maximum or terminal values or limits of the respective limit setting.

Let the voltage drop at the ohmic resistance $R_L$ of the gradient coil 8 amount, for example, to $I \cdot R_L$ and let the desired voltage be a coil voltage U which is intended to correspond to the output voltage $U_{out}$ output by the switch-mode output stage 4. As the coil current I increases, the product $I \cdot R_L$ becomes ever greater, and consequently the coil voltage U ever smaller. During a current buildup, the relation $U_{up} = U_{out} - I \cdot R_L$ applies, in other words the voltage at the gradient coil becomes smaller with increasing coil current. Now let demagnetization occur with the current flow continuing to be present and let the output voltage of the switch-mode output stage 4 be switched to a reverse or an opposite polarity, though with the current still flowing in the same direction as previously. In an ensuing current reduction, the relation $U_{down} = -U_{out} - I \cdot R_L$ then obtains for a corresponding voltage. Accordingly, the voltage $U_{up}$ effective at the gradient coil 8 during the current buildup is reduced in its absolute value, while the voltage $U_{down}$ effective during the current reduction of the gradient coil 8, in contrast, increases in its absolute value.

This can be compensated for by a compensation adjustment of the limit setting, i.e. of the limit for the limiter stage 14, in that the value $I \cdot R_L$ is factored into the limit setting as a function of time and current direction. The value $I \cdot R_L$ is added to the previous or uncompensated limit for the purpose of calculating the current-dependent compensated limit setting. Let +1000 V be provided for example as the positive limit and −1000 V as the negative limit. In addition, let a coil current I then flow, for example, which effects a voltage drop of currently 50 V at or in the gradient coil 8. There is thus yielded as result for the current-dependent compensated positive limit $\text{Limit}_{pos,comp}(I) = +1000 \text{ V} + 50 \text{ V} = 1050 \text{ V}$, and consequently a coil voltage of $U_{up} = 1050 \text{ V} - 50 \text{ V} = 1000 \text{ V}$ for the current buildup. For the current-dependent negative compensated limit, there is correspondingly yielded as result $\text{Limit}_{neg,comp}(I) = -1000 \text{ V} + 50 \text{ V} = \text{minus } 950 \text{ V}$, and correspondingly a coil voltage of $U_{down} = -(-950 \text{ V}) + 50 \text{ V} = 1000$ V during the current decrease. The voltage drop at the ohmic resistance of the gradient coil 8—or generally at a corresponding load resistance—is compensated for by the parallel shifting of the limits—in this case, therefore, by +50 V, for example. If a momentary changeover from positive to negative voltage takes place due to a corresponding drive action while load or coil current is flowing, the coil voltage then remains within the voltage range of ±1000 V predefined or determined by the compensated limits.

To compensate for an effect of the semiconductor elements of the switch-mode output stage 4, a nonlinear load resistance can correspondingly be assumed, for example as a function of a diode characteristic curve, and used according to the above example calculation likewise for the parallel shifting of the limits, i.e. for calculating or setting the corresponding compensated limits. Equally, it is possible, in order to minimize an outlay on resources, to add globally a typical forward voltage of the semiconductor elements of the switch-mode output stage 4 as a function of the current direction to the current, non-compensated limits. By this device(s), the effect of the semiconductor elements can be compensated for at least in a first approximation.

It goes without saying that the different embodiments of the MRT system and of the gradient amplifiers 1, 11, 31 described herein by way of example can be combined with one another. Thus, for example, the modulator 3 provided in the third gradient amplifier 31 or the limiter stage 14 provided in the third gradient amplifier 31 may also comprise the calculation unit 18.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit arrangement of a system, comprising:
    a gradient coil;
    a gradient amplifier, the gradient amplifier including
        a switch-mode output stage to provide a voltage for the gradient coil at an output of the switch-mode output stage,
        a regulator device to regulate a current for the gradient coil based upon a current setpoint value and a current actual value, tappable on an output side of the switch-mode output stage, and a modulator, electrically connected between the regulator device and the switch-mode output stage, to generate a modulator signal for driving the switch-mode output stage, the modulator signal specifying a pulse width modulation for the switch-mode output stage based upon a control signal output by the regulator device; and a circuit arrangement, to drive the gradient coil to ensure patient safety, a control path being integrated into a drive path of the circuit arrangement, the control path including a limiter stage, connected downstream of the regulator device, the modulator, the switch-mode output stage, and a supply voltage of the switch-mode output stage, wherein the limiter stage is connected between the regulator device and an input of the modulator, the limiter stage being configured to limit the control signal and being configured to limit the supply voltage of the switch-mode output stage.

2. The circuit arrangement of claim 1, wherein the control path comprises at least one monitoring device including at least one of the limiter stage,
the modulator,
the switch-mode output stage, and
the supply voltage of the switch-mode output stage.

3. The circuit arrangement of claim 1, further comprising:
a protect path including a current measuring unit, arranged on the output side of the switch-mode output stage, to measure the current actual value,
a transmission path, from the current measuring unit to a control device, and
a shutdown path from the control device to output drivers of the modulator, the transmission path and the shutdown path being provided for outputting the modulator signal to the switch-mode output stage.

4. The circuit arrangement of claim 1, further comprising:
a control device, connected to the limiter stage, to transmit a limit setting to the limiter stage and respectively read out respective current limit settings from the limiter stage.

5. The circuit arrangement of claim 1, wherein the limiter stage is connected to a calculation unit, the calculation unit being configured to determine a root mean square value of a resulting voltage for at least one channel of the gradient coil based upon an output signal of the limiter stage and the calculation unit being configured to adjust a limit setting of the limiter stage as a function of at least one first threshold value and the root mean square value of the resulting voltage for the at least one channel.

6. The circuit arrangement of claim 5, wherein the calculation unit includes a low-pass filter and a first comparator to compare an output signal of the low-pass filter with the first threshold value, and to adjust the limit setting to a reduced value lying below a maximum value when the first threshold value is reached.

7. The circuit arrangement of claim 6, wherein the calculation unit comprises a second comparator to compare an output signal of the low-pass filter with a second threshold value, the second threshold value being relatively less than the first threshold value, and to enable the limit setting only upon the output signal of the low-pass filter decreasing to the second threshold value.

8. The circuit arrangement of claim 1, wherein the gradient amplifier includes
a voltage feedback circuit configured to
measure the supply voltage of the switch-mode output stage, and
loop a correction signal, determined as a function of the supply voltage measured, into an electrical connection between the limiter stage and the modulator and to keep a product of a corresponding modulation index of pulse width modulation and the supply voltage of the switch-mode output stage at least substantially constant for every constant control signal.

9. An MRT system, comprising:
a circuit arrangement, including
a gradient coil,
a gradient amplifier, the gradient amplifier including
a switch-mode output stage to provide a voltage for the gradient coil at an output of the switch-mode output stage,
a regulator device to regulate a current for the gradient coil based upon a current setpoint value and a current actual value, tappable on an output side of the switch-mode output stage, and
a modulator, electrically connected between the regulator device and the switch-mode output stage, to generate a modulator signal for driving the switch-mode output stage, the modulator signal specifying a pulse width modulation for the switch-mode output stage based upon a control signal output by the regulator device, and
a circuit arrangement, to drive the gradient coil to ensure patient safety, a control path being integrated into a drive path of the circuit arrangement, the control path including
a limiter stage, connected downstream of the regulator device, the modulator, the switch-mode output stage, and
a supply voltage of the switch-mode output stage, wherein the limiter stage is connected between the regulator device and an input of the modulator, the limiter stage being configured to limit the control signal and being configured to limit the supply voltage of the switch-mode output stage;
a control device, connected to the circuit arrangement, to specify a limit setting for the limiter stage; and
a current measuring unit, arranged on an output side of the switch-mode output stage, to measure a current actual value, the current measuring unit being electrically connected to the regulator device to transmit the current actual value measured, to the regulator device.

10. A method for an MRT system, comprising:
generating a control signal, via a regulator device of the MRT system, as a function of a difference between a current setpoint value and a current actual value, the current actual value being tapped on an output side of a switch-mode output stage of the MRT system and being output to a limiter stage of the MRT system;
defining a current limit setting for the limiter stage, via a control device of the MRT system;
limiting the control signal in accordance with the current limit setting defined, and outputting a limited control signal to a modulator of the MRT system, via the limiter stage;
generating a modulator signal, via the modulator, as a function of the limited control signal; and
specifying a pulse width modulation, for the switch-mode output stage, by the modulator signal to provide a voltage for a gradient coil of the MRT system, wherein a supply voltage of the switch-mode output stage is limited by the current limit setting.

11. The method of claim 10, wherein patient safety is ensured via
a control path of the MRT system, the control path including a plurality of components including the limiter stage, connected downstream of the regulator device, the modulator, the switch-mode output stage, and the supply voltage of the switch-mode output stage, and
at least one monitoring device of the plurality of components of the control path.

12. The method of claim 10, further comprising:
transmitting the current actual value to at least one monitoring device, the at least one monitoring device determining, based upon the current actual value transmitted, whether a maximum value for a temporal rate of change, of at least one of a magnetic field generated via the MRT system and a spatial magnetic field gradient generated via the gradient coil, is exceeded, and
transmitting, upon the maximum value being exceeded, a turn-on signal, via the monitoring device, to a monitoring element of a gradient amplifier of the MRT system, by which the modulator is switched into a freewheeling circuit to initiate a blocking of output drivers of the modulator provided for outputting the modulator signal to the switch-mode output stage.

13. The circuit arrangement of claim 1, wherein the circuit arrangement is for an MRT system.

14. The circuit arrangement of claim 2, further comprising:
a protect path including a current measuring unit, arranged on the output side of the switch-mode output stage, for measuring the current actual value,
a transmission path, from the current measuring unit to a control device, and
a shutdown path from the control device to output drivers of the modulator, the transmission path and the shutdown path being provided for outputting the modulator signal to the switch-mode output stage.

15. The circuit arrangement of claim 2, further comprising:
a control device, connected to the limiter stage, to transmit a limit setting to the limiter stage and respectively read out respective current limit settings from the limiter stage.

16. The circuit arrangement of claim 5, wherein the calculation unit is configured to determine a root mean square value of a resulting voltage for three channels of the gradient coil based upon an output signal of the limiter stage and the calculation unit being configured to adjust a limit setting of the limiter stage as a function of at least one first threshold value and a weighted sum of the root mean square values of the resulting voltage for the three channels.

17. The circuit arrangement of claim 6, wherein the low-pass filter is a first-order low-pass filter, and the limit setting is configured to be adjusted to a reduced value lying below 56% of the maximum value when the first threshold value is reached.

18. The circuit arrangement of claim 2, wherein the limiter stage is connected to a calculation unit, the calculation unit being configured to determine a root mean square value of a resulting voltage for at least one channel of the gradient coil based upon an output signal of the limiter stage and the calculation unit being configured to adjust a limit setting of the limiter stage as a function of at least one first threshold value and the root mean square value of the resulting voltage for the at least one channel.

19. The circuit arrangement of claim 18, wherein the calculation unit includes a low-pass filter and a first comparator to compare an output signal of the low-pass filter with the first threshold value, and to adjust the limit setting to a reduced value lying below a maximum value when the first threshold value is reached.

20. The circuit arrangement of claim 19, wherein the calculation unit comprises a second comparator to compare an output signal of the low-pass filter with a second threshold value, the second threshold value being relatively less than the first threshold value, and to enable the limit setting only upon the output signal of the low-pass filter decreasing to the second threshold value.

21. The circuit arrangement of claim 2, wherein the gradient amplifier includes
a voltage feedback circuit configured to
measure the supply voltage of the switch-mode output stage, and
loop a correction signal, determined as a function of the supply voltage measured, into an electrical connection between the limiter stage and the modulator and to keep a product of a corresponding modulation index of pulse width modulation and the supply voltage of the switch-mode output stage at least substantially constant for every constant control signal.

22. The method of claim 12, wherein the modulator is switched into a freewheeling circuit to initiate, with a delay of less than 50 ms, the blocking of output drivers of the modulator provided for outputting the modulator signal to the switch-mode output stage.

23. The method of claim 11, further comprising:
transmitting the current actual value to at least one monitoring device, the at least one monitoring device determining, based upon the current actual value transmitted, whether a maximum value for a temporal rate of change, of at least one of a magnetic field generated via the MRT system and a spatial magnetic field gradient generated via the gradient coil, is exceeded, and
transmitting, upon the maximum value being exceeded, a turn-on signal, via the monitoring device, to a monitoring element of a gradient amplifier of the MRT system, by which the modulator is switched into a freewheeling circuit to initiate a blocking of output drivers of the modulator provided for outputting the modulator signal to the switch-mode output stage.

24. The method of claim 23, wherein the modulator is switched into a freewheeling circuit to initiate, with a delay of less than 50 ms, the blocking of output drivers of the modulator provided for outputting the modulator signal to the switch-mode output stage.

* * * * *